US010045426B2

(12) United States Patent
Kim et al.

(10) Patent No.: US 10,045,426 B2
(45) Date of Patent: Aug. 7, 2018

(54) SWITCH FOR CONTROLLING LIGHTING USING MAGNETIC SENSING AND TOUCH SENSING AND METHOD USING THE SAME

(71) Applicant: ELECTRONICS AND TELECOMMUNICATIONS RESEARCH INSTITUTE, Daejeon (KR)

(72) Inventors: You-Jin Kim, Daejeon (KR); Tae-Gyu Kang, Daejeon (KR); Dae-Ho Kim, Daejeon (KR); Hyun-Seok Kim, Daejeon (KR); Seong-Hee Park, Daejeon (KR); Jung-Sik Sung, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/603,533

(22) Filed: May 24, 2017

(65) Prior Publication Data

US 2018/0177027 A1  Jun. 21, 2018

(30) Foreign Application Priority Data

Dec. 15, 2016 (KR) .......................... 10-2016-0171909

(51) Int. Cl.
*H01H 36/02* (2006.01)
*H05B 37/02* (2006.01)
(Continued)

(52) U.S. Cl.
CPC ......... *H05B 37/0227* (2013.01); *H01H 36/02* (2013.01); *H01H 89/00* (2013.01); *H03K 17/9622* (2013.01); *H01H 2231/052* (2013.01)

(58) Field of Classification Search
CPC ....... H05B 37/02; H05B 39/085; G06F 3/044; G06F 3/046; G06F 3/042; H02J 7/025;
(Continued)

(56) References Cited

U.S. PATENT DOCUMENTS 9,317,984 B2 * 4/2016 Cregg ................. G07C 9/00309
9,380,681 B2 * 6/2016 Kim .................... H05B 37/0227
(Continued)

FOREIGN PATENT DOCUMENTS

EP        2 934 068 A1   10/2015
JP        2016-504729 A   2/2016
KR    10-2015-0086787 A   7/2015

*Primary Examiner* — Vibol Tan
(74) *Attorney, Agent, or Firm* — LRK Patent Law Firm

(57) ABSTRACT

Disclosed herein are a lighting control switch using magnetic sensing and touch sensing and a method using the lighting control switch. The lighting control switch includes a magnetic sensing module for generating a magnetic sensing signal by sensing a magnetic signal that is generated in order to control a lighting device, a touch-sensing module for generating a touch-sensing signal by sensing a touch signal that is generated in order to control the lighting device, and a control unit for receiving the magnetic signal and the touch signal based on logic control in response to generation of at least one of the magnetic sensing signal and the touch-sensing signal and controlling the lighting device by generating a control signal in consideration of the magnetic signal and the touch signal.

17 Claims, 13 Drawing Sheets

101: USER
111: SLIDE RAIL
120: MAGNETIC SENSING MODULE
130: TOUCH-SENSING MODULE
140: CONTROL UNIT
143: POWER SUPPLY UNIT
141: INTEGRATED SIGNAL-PROCESSING UNIT
110: SLIDE BUTTON
112: MAGNETIC MEMBER
121: MAGNETIC SENSOR
131-134: TOUCH SENSORS
142: CONTROL MODULE
144: COMMUNICATION UNIT

(51) Int. Cl.
*H03K 17/96* (2006.01)
*H01H 89/00* (2006.01)

(58) Field of Classification Search
CPC . H02J 7/345; H03K 17/9645; H03K 17/9622; H03K 17/97; H03K 17/975; H01H 36/02; H01H 89/00; H01H 2231/052
See application file for complete search history.

(56) References Cited

U.S. PATENT DOCUMENTS

| | | | |
|---|---|---|---|
| 9,655,217 B2* | 5/2017 | Recker | H05B 37/0272 |
| 2010/0149127 A1* | 6/2010 | Fisher | G06F 3/0362 |
| | | | 345/174 |
| 2010/0171633 A1* | 7/2010 | Baker | H03K 17/9645 |
| | | | 340/815.45 |
| 2013/0088288 A1 | 4/2013 | Maerz et al. | |
| 2015/0002216 A1 | 1/2015 | Jeon et al. | |
| 2015/0208487 A1* | 7/2015 | Kim | H05B 37/0227 |
| | | | 315/134 |
| 2015/0245451 A1 | 8/2015 | Sung et al. | |
| 2016/0103551 A1* | 4/2016 | Giacomini | H03K 17/96 |
| | | | 345/173 |

* cited by examiner

101: USER
111: SLIDE RAIL
120: MAGNETIC SENSING MODULE
130: TOUCH-SENSING MODULE
140: CONTROL UNIT
143: POWER SUPPLY UNIT
141: INTEGRATED SIGNAL-PROCESSING UNIT

110: SLIDE BUTTON
112: MAGNETIC MEMBER
121: MAGNETIC SENSOR
131-134: TOUCH SENSORS
142: CONTROL MODULE
144: COMMUNICATION UNIT

121: MAGNETIC SENSOR
131: TOUCH SENSOR
141: INTEGRATED SIGNAL-PROCESSING UNIT
211: POWER SUPPLY MODEL
212: RESISTOR MODEL
213: CAPACITANCE MODEL
214: GROUND MODEL
220: FIRST SWITCH
230: SECOND SWITCH
240: CONTROL SIGNAL LINE
250: SIGNAL OUTPUT LINE

SECOND PHASE

FOURTH PHASE

1310: SLIDE SWITCH          1320-1350: TOUCH SENSORS

SWITCH FOR CONTROLLING LIGHTING USING MAGNETIC SENSING AND TOUCH SENSING AND METHOD USING THE SAME

CROSS REFERENCE TO RELATED APPLICATION

This application claims the benefit of Korean Patent Application No. 10-2016-0171909, filed Dec. 15, 2016, which is hereby incorporated by reference in its entirety into this application.

BACKGROUND OF THE INVENTION

1. Technical Field

The present invention relates generally to technology for controlling lighting, and more particularly to a lighting control switch using magnetic sensing and touch sensing, which is capable of controlling a lighting device using a mode in which both magnetic sensing and touch sensing are performed, and a method using the lighting control switch.

2. Description of the Related Art

Generally, a lighting switch apparatus is configured such that a slide switch is separate from a touch sensor switch.

Accordingly, users may feel a discontinuity between a sensation of pressing a slide switch through a mechanical movement and a sensation of touching a touch sensor switch. For example, when a user moves a slide switch to an OFF or ON position, if a touch can be separately input to a touch sensor at the same time or if only the touch is input to the touch sensor, the user may feel such a discontinuity.

Due to this problem, it is difficult to provide an integrated and seamless user experience when controlling a lighting device. For example, if two separate components are simply combined, when input to the two components is simultaneously made, it is difficult to subdivide and control operation modes, and users may have a discontinuous user experience as if separate control were possible through the individual components. Particularly, when dimming of a lighting device is controlled through communication, it is necessary to provide smooth dimming so that users feel comfortable in a lighting environment. However, control based on separate components is problematic in that it is difficult to provide smooth dimming control. In connection with this, U.S. Patent Application Publication No. 2010-0149127 discloses a technology related to "Integrated contact switch and touch sensor elements."

SUMMARY OF THE INVENTION

An object of the present invention is to provide an integrated and seamless user experience in order to prevent users who control a lighting device from feeling a discontinuity between when a sensation of pressing a slider through a mechanical movement finishes and when a touch input is generated.

Another object of the present invention is to smoothly adjust the brightness of a lighting device during the interval between the time at which the lighting device can be controlled through magnetic sensing and the time at which the lighting device can be controlled through touch sensing and to thereby provide a more natural lighting environment not only to a user who controls the lighting device but also to other users located in the environment affected by the lighting device.

A further object of the present invention is to provide switch control technology that is adaptable also to an input switch device used in various portable or mobile devices, whereby an integrated and seamless user experience may be provided through various devices as well as lighting devices.

In order to accomplish the above objects, a lighting control switch according to the present invention includes a magnetic sensing module for generating a magnetic sensing signal by sensing a magnetic signal that is generated in order to control a lighting device; a touch-sensing module for generating a touch-sensing signal by sensing a touch signal that is generated in order to control the lighting device; and a control unit for receiving the magnetic signal and the touch signal based on logic control in response to generation of at least one of the magnetic sensing signal and the touch-sensing signal and controlling the lighting device by generating a control signal in consideration of the magnetic signal and the touch signal.

Here, the control unit may be configured to detect an intermediate mode in which both an intensity of the magnetic signal and an intensity of the touch signal correspond to a transition state and to control the lighting device such that brightness thereof steadily increases to a preset level during the intermediate mode.

Here, the control unit may be configured to detect a point at which the intensity of the magnetic signal increases by preset levels or more and at which the intensity of the touch signal also increases to a preset reference intensity and to recognize the point as the intermediate mode.

Here, the control unit may include an integrated signal-processing unit for adjusting a connection of a first switch for receiving the magnetic signal and a connection of a second switch for receiving the touch signal based on the logic control; and a communication unit for receiving information about the lighting device via a lighting control network and delivering the control signal to the lighting device.

Here, the integrated signal-processing unit may be configured to connect the first switch but disconnect the second switch when the magnetic sensing signal is generated; and to connect the second switch but disconnect the first switch when the touch-sensing signal is generated after the intermediate mode is detected.

Here, the magnetic sensing module may generate the magnetic sensing signal by sensing the magnetic signal, generated by a magnetic member included in a slide button, using a magnetic sensor, the magnetic signal being sensed only when the slide button enters into a range corresponding to an ON state.

Here, the touch-sensing module may generate the touch-sensing signal when a change in capacitance caused by a touch by a user is sensed through a touch sensor, but may generate the touch-sensing signal only for a change in the capacitance caused by a touch that is sensed after a change in the capacitance caused by the magnetic member is sensed.

Here, the control signal may be acquired by interpreting the magnetic signal and the touch signal and take a form available in communication with the lighting device.

Here, the magnetic member may generate the magnetic signal having an intensity that is capable of being sensed by the magnetic sensor only when the slide button enters into the range corresponding to the ON state.

Also, a lighting control method using a lighting control switch according to an embodiment of the present invention includes generating a magnetic sensing signal by sensing a magnetic signal that is generated in order to control a lighting device; generating a touch-sensing signal by sensing a touch signal that is generated in order to control the lighting device; receiving the magnetic signal and the touch signal based on logic control in response to generation of at least one of the magnetic sensing signal and the touch-sensing signal; and controlling the lighting device by generating a control signal in consideration of the magnetic signal and the touch signal.

Here, the lighting control method may further include detecting an intermediate mode in which both an intensity of the magnetic signal and an intensity of the touch signal correspond to a transition state; and controlling the lighting device such that brightness thereof steadily increases to a preset level during the intermediate mode.

Here, detecting the intermediate mode may be configured to detect a point at which the intensity of the magnetic signal increases by preset levels or more and at which the intensity of the touch signal also increases to a preset reference intensity and to recognize the point as the intermediate mode.

Here, receiving the magnetic signal and the touch signal may be configured to receive the magnetic signal and the touch signal by adjusting a connection of a first switch for receiving the magnetic signal and a connection of a second switch for receiving the touch signal based on the logic control.

Here, controlling the lighting device may be configured to receive information about the lighting device via a lighting control network and to deliver the control signal to the lighting device.

Here, receiving the magnetic signal and the touch signal may be configured to connect the first switch but disconnect the second switch when the magnetic sensing signal is generated; and to connect the second switch but disconnect the first switch when the touch-sensing signal is generated after the intermediate mode is detected.

Here, generating the magnetic sensing signal may be configured to generate the magnetic sensing signal by sensing the magnetic signal, generated by a magnetic member included in a slide button, using a magnetic sensor, the magnetic signal being sensed only when the slide button enters into a range corresponding to an ON state.

Here, generating the touch-sensing signal may be configured to generate the touch-sensing signal when a change in capacitance, caused by a touch by a user, is sensed through a touch sensor, but to generate the touch-sensing signal only for a change in the capacitance caused by a touch that is sensed after a change in the capacitance caused by the magnetic member is sensed.

Here, the control signal may be acquired by interpreting the magnetic signal and the touch signal and take a form available in communication with the lighting device.

Here, the magnetic member may generate the magnetic signal having an intensity that is capable of being sensed by the magnetic sensor only when the slide button enters into the range corresponding to the ON state.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
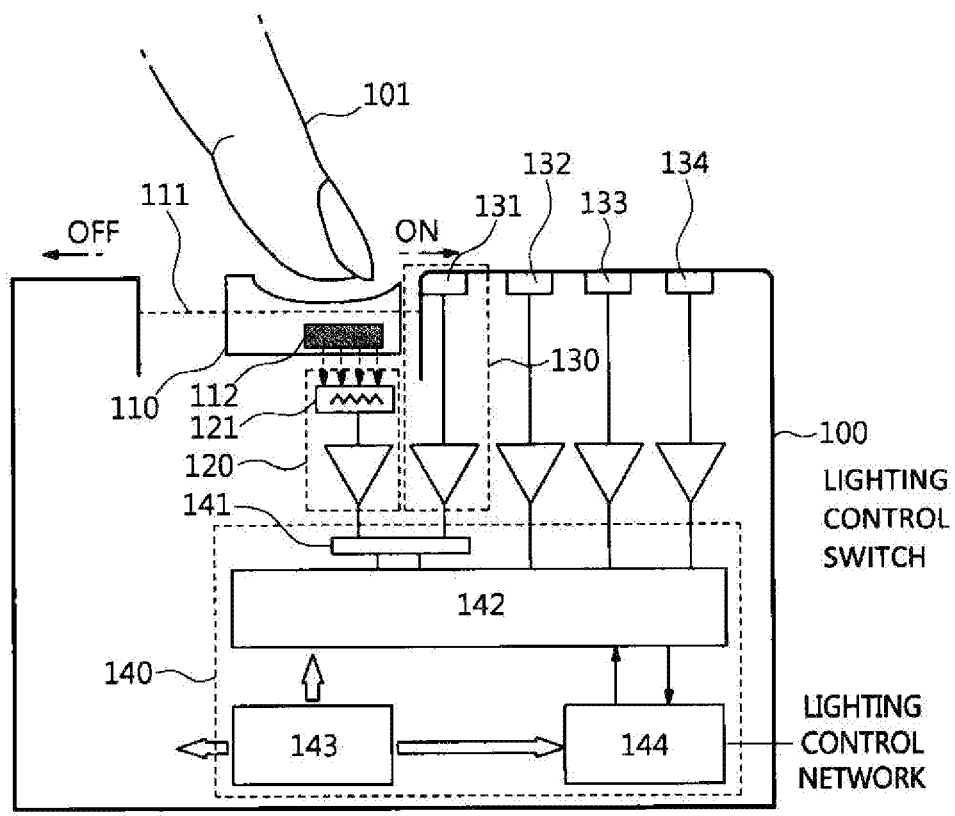
FIG. 1 is a view that shows a lighting control switch according to an embodiment of the present invention.

The present invention will be described in detail below with reference to the accompanying drawings. Repeated descriptions and descriptions of known functions and configurations which have been deemed to make the gist of the present invention unnecessarily obscure will be omitted below. The embodiments of the present invention are intended to fully describe the present invention to a person having ordinary knowledge in the art to which the present invention pertains. Accordingly, the shapes, sizes, etc. of components in the drawings may be exaggerated in order to make the description clearer.

Hereinafter, a preferred embodiment according to the present invention will be described in detail with reference to the accompanying drawings.

FIG. 1 is a view that shows a lighting control switch according to an embodiment of the present invention.

Referring to FIG. 1, a lighting control switch 100 according to an embodiment of the present invention includes a slide button 110, which includes a magnetic member 112, a magnetic sensing module 120, a touch-sensing module 130, and a control unit 140.

Hereinafter, the components of the lighting control switch 100 illustrated in FIG. 1 will be described based on the operating sequence of the lighting control switch 100.

First, the slide button 110, which includes the magnetic member 112 therein, may be moved along a slide rail 111 depending on manipulation by a user while being supported by the slide rail 111.

Here, the magnetic member 112, located inside the slide button 110, may emit magnetic flux, that is, magnetic force, the range of which is constant. Accordingly, when the slide button 110 is moved to a position corresponding to an ON state, a magnetic sensor 121, included in the magnetic sensing module 120, may sense the magnetic flux.

Therefore, the magnetic member 112 may generate a magnetic signal, that is, magnetic force, having an intensity that can be sensed by the magnetic sensor 121 only when the slide button 110 enters into the range corresponding to the ON state by being moved along the slide rail 111.

Here, the magnetic sensing module 120 generates a magnetic sensing signal by sensing the magnetic signal that is generated in order to control a lighting device.

That is, the magnetic sensing module 120 generates the magnetic sensing signal by sensing the magnetic signal, generated by the magnetic member 112 included in the slide button 110, through the magnetic sensor 121, but the magnetic signal may be sensed by the magnetic sensor 121 only when the slide button 110 is located within the range corresponding to the ON state.

When the magnetic signal is sensed by the magnetic sensor 121, the magnetic sensing signal processed in the magnetic sensing module 120 may be delivered to the control unit 140. For example, when the magnetic sensor 121 senses a magnetic signal and generates a magnetic sensing signal, a magnetic sensing signal-processing unit included in the magnetic sensing module 120 may process the magnetic sensing signal and deliver it to the control unit 140.

Also, when a user 101 moves the slide button 110 to the position corresponding to the ON state, magnetic force emitted by the magnetic member 112 may cause a change in the capacitance of a touch sensor 131 included in the touch-sensing module 130. Accordingly, the touch-sensing module 130 determines that the slide button 110 has been moved to the ON position by the user 101, and may thereby predict that a touch will be sensed.

Here, when the user 101 touches the part at which the slide button 110 and the touch sensor 131 are in contact, whereby the capacitance is changed, that is, when a touch signal is generated, the touch sensor 131 may sense the touch signal.

Here, the touch-sensing module 130 generates a touch-sensing signal by sensing the touch signal that is generated in order to control the lighting device.

That is, the touch-sensing module 130 generates a touch-sensing signal when the touch sensor 131 senses the change in the capacitance caused by the touch by the user 101, but may generate the touch-sensing signal only for the change in the capacitance caused by the touch that is necessarily sensed after the change in the capacitance caused by the magnetic member 112 is sensed.

When a touch signal is sensed by the touch sensor 131, a touch-sensing signal processed in the touch-sensing module 130 may be delivered to the control unit 140. For example, when the touch sensor 131 generates a touch-sensing signal as a result of sensing the touch signal caused by a touch by the user 101 after sensing the change in the capacitance caused by the magnetic member 112, a touch-sensing signal-processing unit included in the touch-sensing module 130 may process the touch-sensing signal and deliver it to the control unit 140.

Here, as illustrated in FIG. 1, the touch sensor may be variously configured, like the touch sensors 132, 133 and 134, as well as the touch sensor 131, which is located in contact with the slide button 110. However, only the touch sensor 131 may generate the touch-sensing signal by sensing the change in the capacitance caused by the user 101 who moved the slide button 110.

The control unit 140 receives a magnetic signal and a touch signal based on logic control in response to the generation of at least one of a magnetic sensing signal and a touch-sensing signal, and then controls the lighting device by generating a control signal in consideration of the magnetic signal and the touch signal.

Here, an integrated signal-processing unit 141 included in the control unit 140 may receive the magnetic signal and the touch signal and perform integrating processing thereon based on logic control input from a control module 142.

Here, an intermediate mode in which both the intensity of a magnetic signal and that of a touch signal correspond to a transition state is detected, and the lighting device may be controlled such that the brightness thereof gradually increases to a preset level during the intermediate mode.

For example, the integrated signal-processing unit 141 may check whether conditions for an intermediate mode are satisfied in the process of receiving and processing the magnetic signal and the touch signal at the same time. Here, if the integrated signal-processing unit 141 informs the control module 142 of the intermediate mode, the control module 142 generates a control signal corresponding thereto and controls the lighting device so as to correspond to the intermediate mode.

Here, the lighting device may be controlled based on the control signal corresponding to the intermediate mode such that the brightness steadily increases from the brightness corresponding to the ON state, set by the movement of the slide button 110, to the brightness adjustable by sensing a touch. For example, if the brightness of a lighting device corresponding to the ON state, set by the movement of the slide button 110, is 45% of the maximum brightness and if the brightness adjustable by sensing a touch ranges from 50% of the maximum brightness to 100% thereof, the lighting device may be controlled such that the brightness steadily increases from 45% of the maximum brightness to 50% thereof during the intermediate mode.

Here, the point at which the intensity of a magnetic signal increases by preset levels or more and at which the intensity of a touch signal also increases to a preset reference intensity may be detected as the intermediate mode.

For example, if the intensity of a magnetic signal is classified into five levels, from a first level having the lowest intensity to a fifth level having the highest intensity, and if the preset number of levels for detecting an intermediate mode is set to three levels, when the intensity of the magnetic signal increases by three levels from the first level to the fourth level, the intensity of a touch signal may be checked. Here, if the intensity of the received touch signal corresponds to the preset reference intensity for detecting the intermediate mode, the corresponding point may be detected as the intermediate mode.

Here, the connection of a first switch for receiving a magnetic signal and the connection of a second switch for receiving a touch signal may be adjusted based on logic control through the integrated signal-processing unit 141 included in the control unit 140.

Here, the integrated signal-processing unit 141 may connect the first switch but disconnect the second switch based on the logic control of the control module 142 when a magnetic sensing signal is generated. Also, the integrated signal-processing unit 141 may connect the second switch but disconnect the first switch when a touch-sensing signal is generated after the intermediate mode is detected.

Here, through a communication unit 144 included in the control unit 140, information about the lighting device may be received via the lighting control network, and a control signal may be delivered to the lighting device.

Here, the lighting control network receives information related to lighting control from the lighting device and interprets the information, and may then deliver it to the control unit 140. For example, information about whether the brightness of the lighting device is correctly controlled in response to the control signal of the control unit 140, information about whether control of the lighting device in response to the control signal is impeded by a problem occurring in the lighting device, or the like may be delivered to the control unit 140.

Here, the control signal is acquired by interpreting the magnetic signal and the touch signal, and may take a form available in communication with the lighting device.

Here, a power supply unit 143 included in the control unit 140 may supply power to the lighting control switch 100 according to an embodiment of the present invention and peripherals of the lighting control switch 100.

Through the lighting control switch configured as described above, it is possible to provide an integrated and seamless user experience through which a user who controls a lighting device may be prevented from feeling a discontinuity between when a sensation of pressing a slide button through a mechanical movement finishes and when input by a touch is generated.

Also, the brightness of a lighting device is naturally adjusted during the interval between the time at which the lighting device can be controlled through magnetic sensing and the time at which the lighting device can be controlled through touch sensing, whereby more natural lighting may be provided not only to a user who directly controls the lighting device but also to other users in the environment affected by the lighting device.

Figure 2:
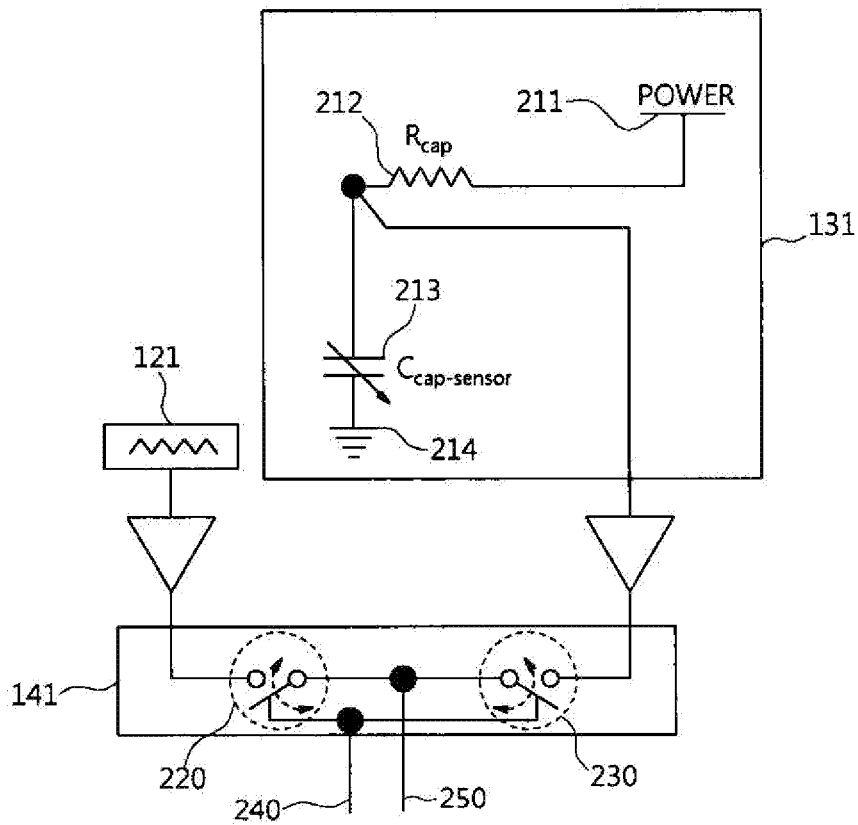
FIG. 2 is a view for explaining logic control in the integrated signal-processing unit illustrated in FIG. 1.

FIG. 2 is a view for explaining logic control in the integrated signal-processing unit illustrated in FIG. 1.

Referring to FIG. 2, the integrated signal-processing unit 141 illustrated in FIG. 1 may receive a magnetic sensing signal generated by the magnetic sensor 121 and a touch-sensing signal generated by a touch-sensing module 131 based on their signal reception lines.

Here, a first switch 220 may be placed on the signal reception line for receiving a magnetic sensing signal, and a second switch 230 may be placed on the signal reception line for receiving a touch-sensing signal.

Accordingly, the integrated signal-processing unit 141 may connect any one of the first switch 220 and the second switch 230 by receiving information related to logic control from a control module via a control signal line 240.

For example, when logic control for receiving a magnetic signal is performed by the control module through the control signal line 240, the magnetic signal may be received from the magnetic sensing module by connecting the first switch 220. Here, the received magnetic signal may be processed in the integrated signal-processing unit 141 and may then be delivered to the control module via a signal output line 250. In this case, if a touch-sensing signal is generated and the control module performs logic control for receiving a touch signal through the control signal line 240 in response to the touch-sensing signal, the touch signal may be received from the touch-sensing module by disconnecting the first switch 220 and connecting the second switch 230.

Here, the touch-sensing module illustrated in FIG. 2 may be configured with a power supply model 211, a resistor model 212, a capacitance model 213, and a ground model 214.

Figure 3:
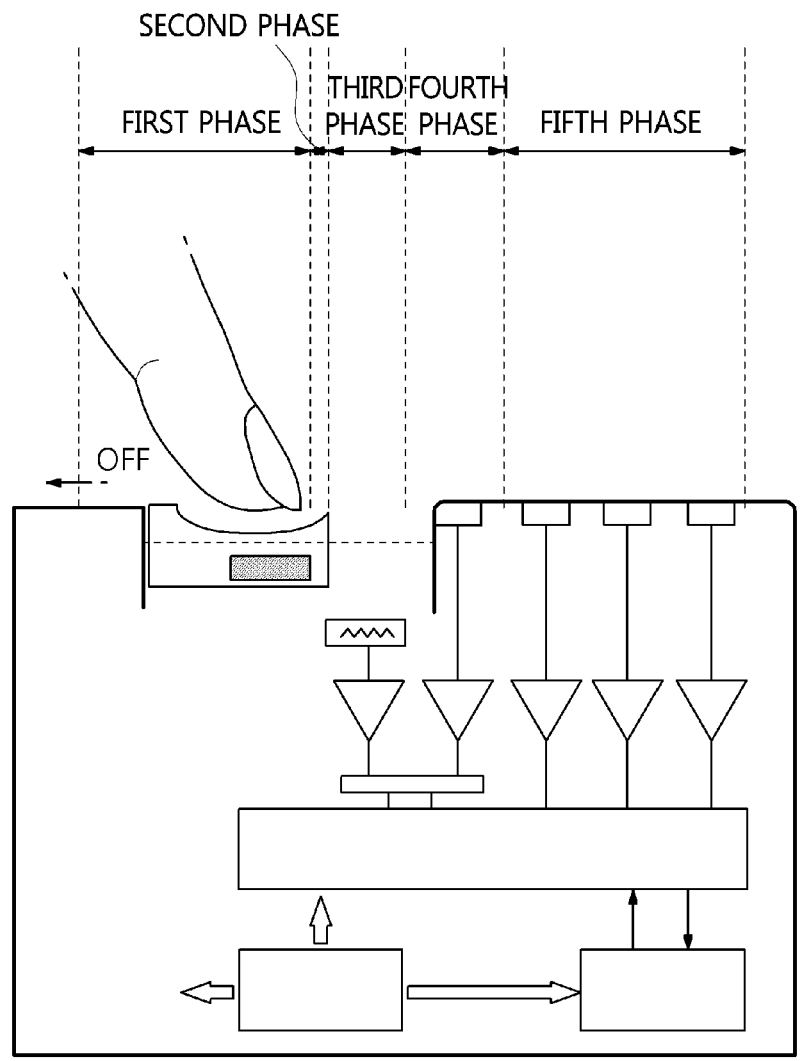
FIGS. 3 to 5 are views that show the process of controlling lighting in phases using a lighting control switch according to the present invention.
Figure 4:
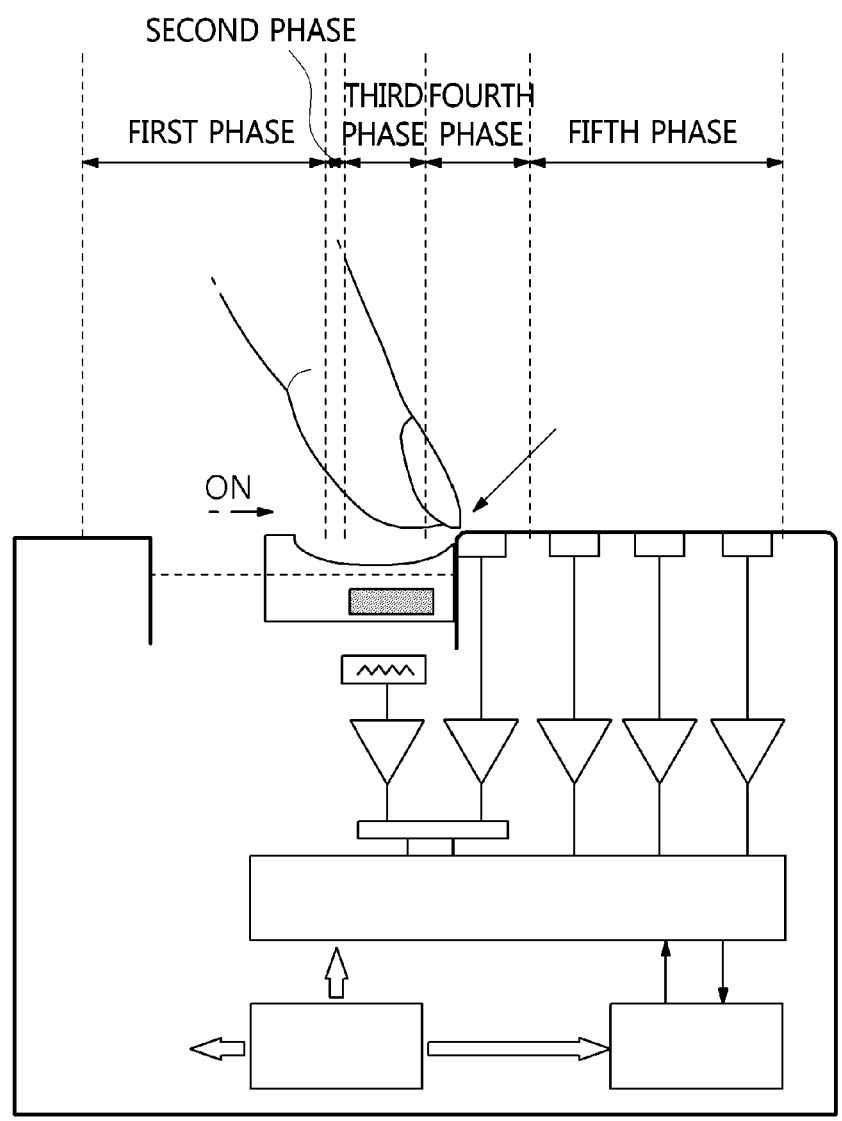
Figure 5:
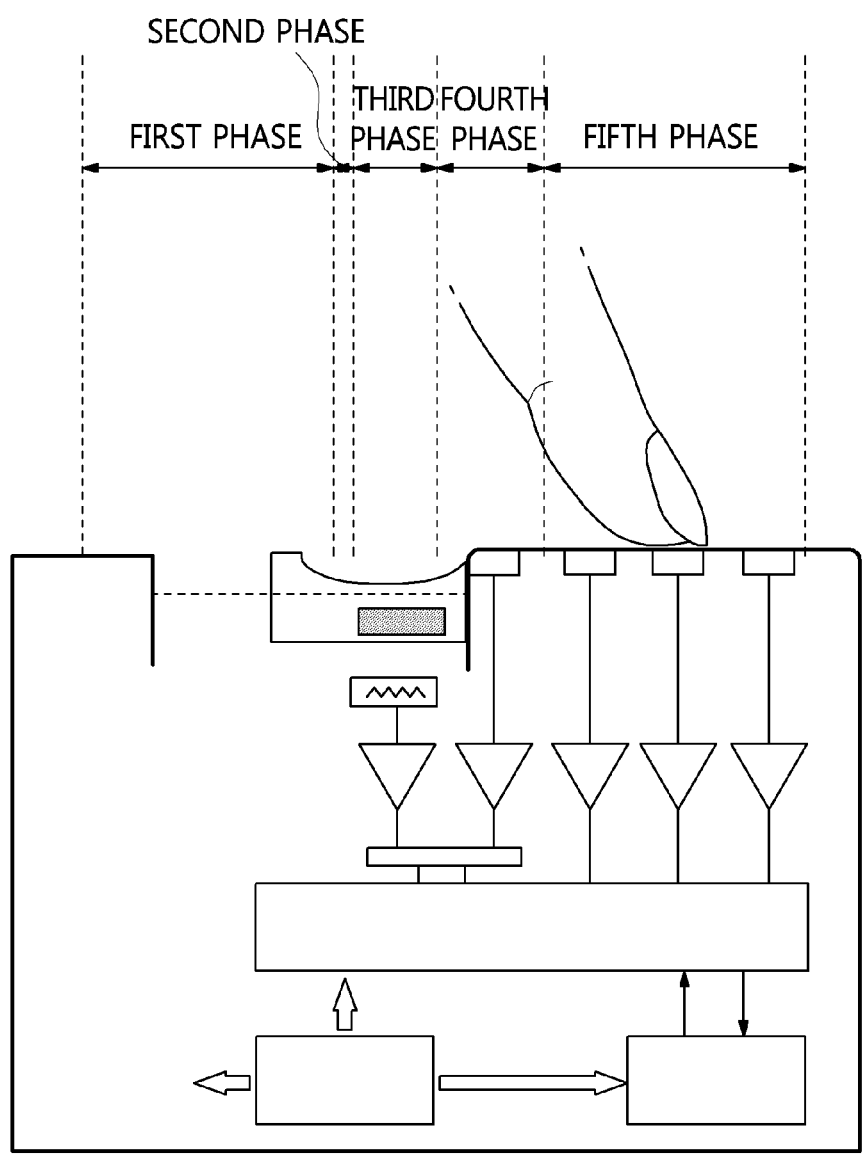

FIGS. 3 to 5 are views that show the process of controlling lighting in phases through a lighting control switch according to the present invention.

Referring to FIGS. 3 to 5, a lighting control switch according to the present invention may operate in five phases.

Figure 6:
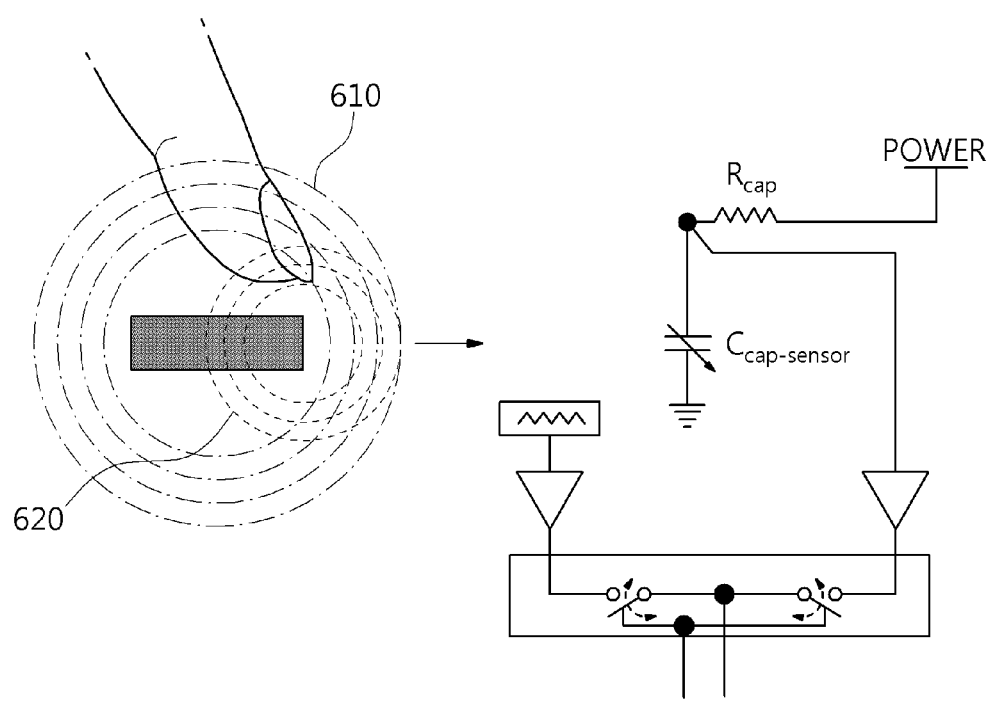
FIGS. 6 to 9 are views that show an example in which a magnetic signal and a touch signal are applied based on phases of controlling lighting according to the present invention.

Here, the operation in the first phase, illustrated in FIG. 3, corresponds to the state illustrated in FIG. 6, in which the magnetic signal 610 does not affect the magnetic sensor because a slide button, including a magnetic member therein, is located at an OFF position.

Figure 7:
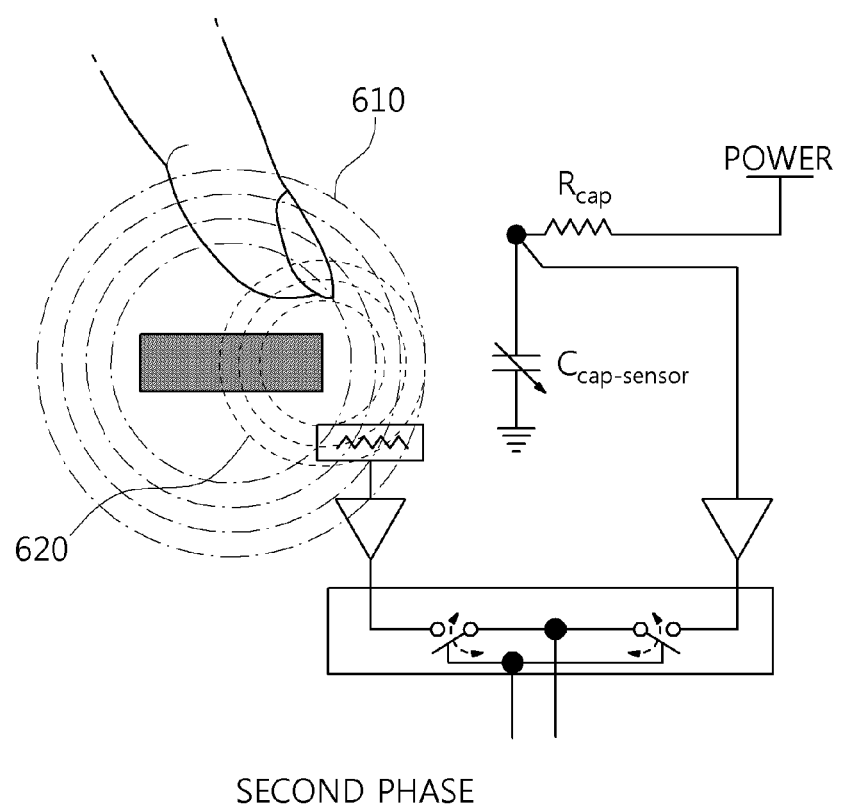

Also, the operation in the second phase, illustrated in FIG. 3, corresponds to the state illustrated in FIG. 7, in which the magnetic signal 610 slightly affects the magnetic sensor because the slide button, including the magnetic member therein, is moving to an ON position.

However, the capacitance is not yet changed by the magnetic signal because the magnetic signal 610 does not affect the capacitance model included in the touch-sensing module.

Figure 8:
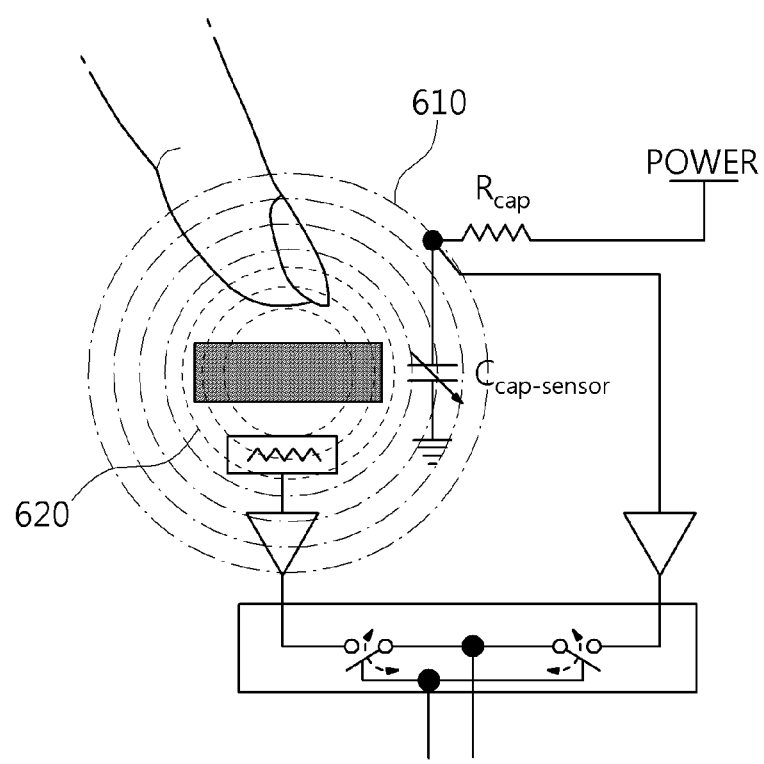

Here, the operation in the third phase, illustrated in FIG. 4, corresponds to the state illustrated in FIG. 8, in which the magnetic signal 610 affects both the magnetic sensor and the touch sensor at the same time because the slide button, including the magnetic member, is completely located at the ON position. Accordingly, the touch sensor senses a change in the capacitance, caused by the magnetic signal 610, and may determine that the slide button is located at the ON position.

Figure 9:
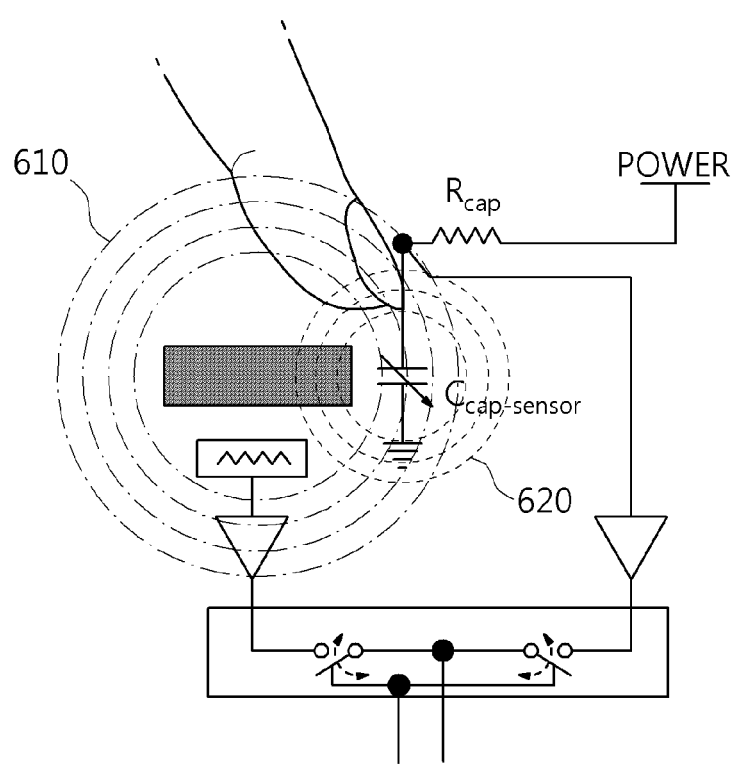

Also, the operation in the fourth phase, illustrated in FIG. 4, corresponds to the state illustrated in FIG. 9, in which the magnetic signal 610 affects both the magnetic sensor and the touch sensor and in which entry into an intermediate mode, in which the touch signal 620 generated from a touch by a user causes a change in the capacitance in the capacitance model, is started.

Here, the operation in the fifth phase, illustrated in FIG. 5, may correspond to the state in which a touch by the user affects a separate touch sensor rather than the touch sensor included in the touch-sensing module. That is, this case corresponds to the state in which the user inputs a touch signal through the separate touch sensor in order to adjust the brightness of the lighting device.

Figure 10:
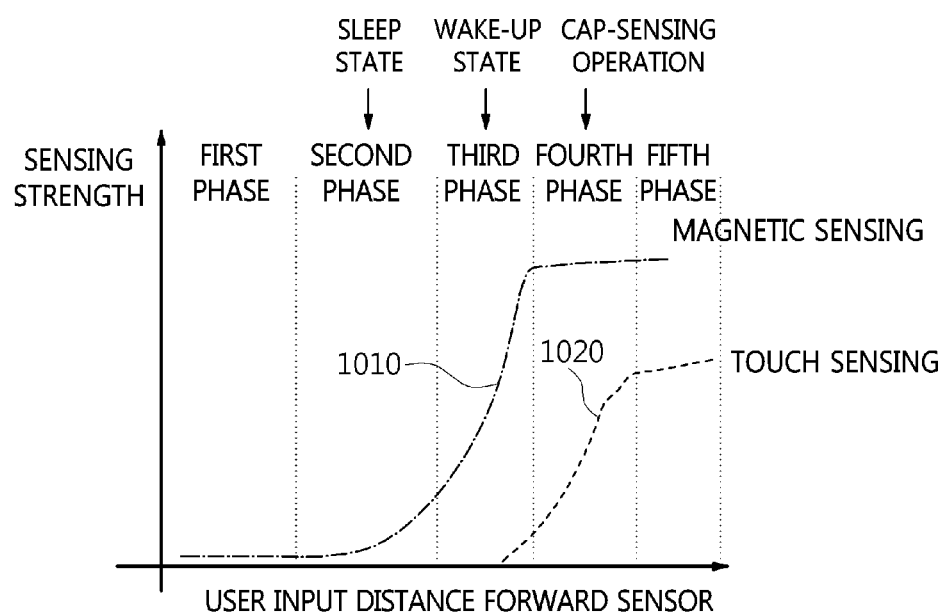
FIG. 10 is a view that shows the intensity of a magnetic signal and that of a touch signal sensed based on phases of controlling lighting according to an embodiment of the present invention.

FIG. 10 is a view that shows the intensity of a magnetic signal and that of a touch signal sensed at each lighting control phase according to an embodiment of the present invention.

Referring to FIG. 10, in the first phase of the five phases illustrated in FIGS. 3 to 5, because neither a magnetic signal nor a touch signal is sensed, there is no change in either the magnetic signal intensity 1010 or the touch signal intensity 1020. That is, this case may correspond to the state in which the lighting device is turned off.

Also, in the second phase of the five phases illustrated in FIGS. 3 to 5, the sensed magnetic signal intensity 1010 steadily increases, as shown in FIG. 10, which may correspond to the section in which a user is moving a slide button to the ON position. That is, in the section corresponding to the second phase, the user may feel a mechanical movement. Here, the optical power of the lighting device may increase from 0%.

In this case, because a touch signal, which can be generated from a touch by the user, is not sensed, the control unit of the lighting control switch according to an embodiment of the present invention may control the touch-sensing module so as to enter a sleep state in order to reduce the power consumed for touch sensing.

Also, the third phase of the five phases illustrated in FIGS. 3 to 5 may correspond to the intermediate mode, in which the sensed magnetic signal intensity 1010 increases up to the maximum intensity and the sensed touch signal intensity 1020 also increases by a certain amount, as shown in FIG. 10. That is, the user moves the slide button completely to the ON position, and at the same time, a slight change in the capacitance is caused by the user, whereby it may be confirmed that it is the time right before touch sensing is performed. Therefore, the section corresponding to the third phase may be configured such that a user feels the mechanical movement coming to an end and such that control will be performed naturally by a touch. Here, the optical power of the lighting device may increase to about 45%.

Here, the control unit of the lighting control switch controls the touch-sensing module so as to enter a wake-up state in order to make the touch-sensing module prepare for touch sensing expected to be generated.

Also, the fourth phase of the five phases illustrated in FIGS. 3 to 5 is the section in which magnetic sensing and touch sensing are performed at the same time, as shown in FIG. 10. That is, this case may correspond to the state in which a user moves the slide button completely to the ON position and touches the touch sensor at the same time. Accordingly, the user may continuously control the lighting device using the touch sensor and may receive a feeling that he or she is himself or herself continuously controlling the lighting device. Here, the optical power may be steadily increased to about 50%.

Here, the control unit of the lighting control switch may control the touch-sensing module so as to perform a capacitance-sensing operation for normal touch sensing.

Also, the fifth phase of the five phases illustrated in FIGS. 3 to 5 is the section in which only touch sensing is performed, as shown in FIG. 10, and a feeling that the lighting device is controlled only through a touch sensor may be given to the user. Here the optical power may be controlled within the range from 50% to 100%.

As described above, through the five phases for controlling lighting, a sense of touch is continuously provided to a user seamlessly after a sensation of pressing a slide button through a mechanical movement, whereby it is possible to provide an integrated and seamless user experience through which a user may be prevented from feeling a discontinuity between control through the slide button and control through touch.

Figure 11:
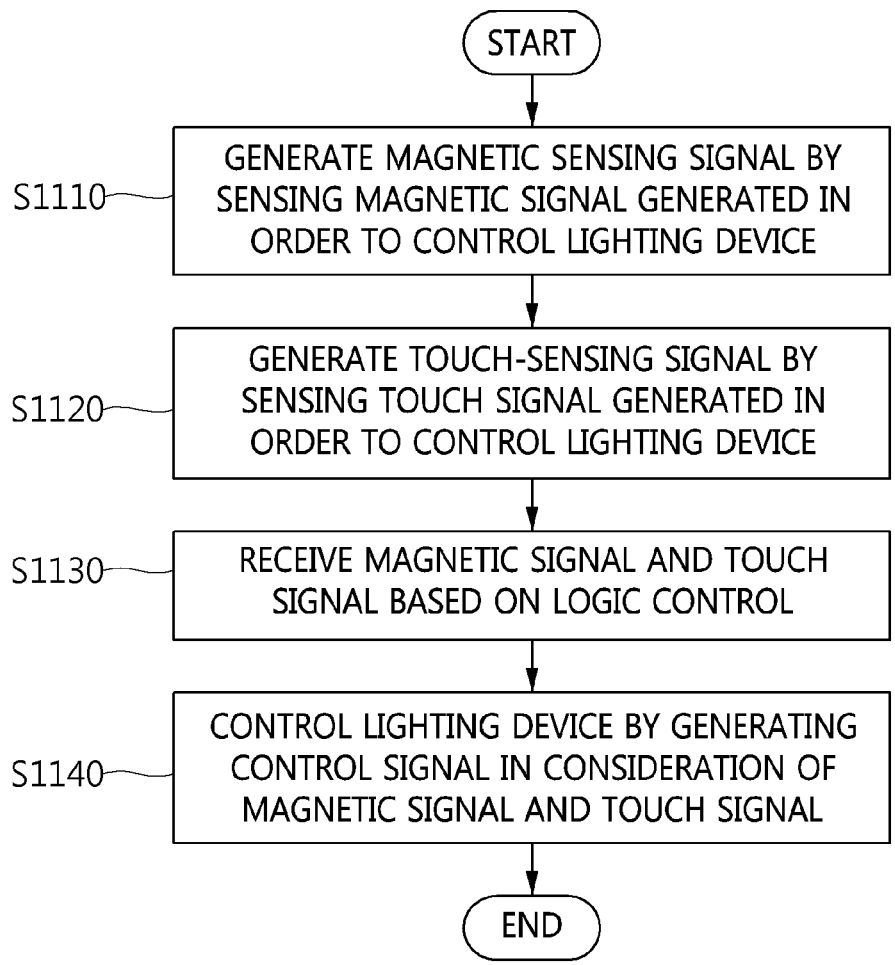
FIG. 11 is a flowchart that shows a lighting control method using a lighting control switch according to an embodiment of the present invention.

FIG. 11 is a flowchart that shows a lighting control method using a lighting control switch according to an embodiment of the present invention.

Referring to FIG. 11, in the lighting control method using a lighting control switch according to an embodiment of the present invention, a magnetic sensing signal is generated at step S1110 by sensing a magnetic signal that is generated for controlling a lighting device.

Here, the magnetic sensing signal may be generated by sensing the magnetic signal, generated by a magnetic member included in a slide button, through a magnetic sensor.

Here, the slide button, including the magnetic member, may be moved along a slide rail depending on manipulation by a user while being supported by the slide rail.

Here, the magnetic member located inside the slide button may emit magnetic flux, that is, magnetic force, the range of which is constant. Accordingly, when the slide button is moved to a position corresponding to an ON state, the magnetic sensor included in the magnetic sensing module may sense the magnetic flux.

Therefore, the magnetic member may generate a magnetic signal, that is, magnetic force, having an intensity that can be sensed by the magnetic sensor only when the slide button enters into the range corresponding to the ON state by being moved along the slide rail.

Here, the magnetic signal may be sensed by the magnetic sensor only when the slide button is located within the range corresponding to the ON state.

As described above, when the magnetic signal is sensed by the magnetic sensor, a magnetic sensing signal processed in the magnetic sensing module may be delivered to the control unit. For example, when the magnetic sensor senses the magnetic signal and generates a magnetic sensing signal, the magnetic sensing signal-processing unit included in the magnetic sensing module may process the magnetic sensing signal and deliver it to the control unit.

Also, when a user moves the slide button to the position corresponding to the ON state, the magnetic force emitted by the magnetic member may cause a change in the capacitance of the touch sensor included in the touch-sensing module. Accordingly, the touch-sensing module determines that the slide button is moved to the ON position by the user and predicts that a touch will be sensed.

Also, in the lighting control method using a lighting control switch according to an embodiment of the present invention, a touch-sensing signal is generated at step S1120 by sensing a touch signal that is generated in order to control the lighting device.

That is, when a user's touch on the part at which the slide button and the touch sensor are in contact causes a change in capacitance, that is, when a touch signal is generated, the touch sensor may sense this.

Here, the touch-sensing signal is generated when the touch sensor senses a change in the capacitance caused by the touch by a user, but the touch-sensing signal may be generated only for the change in the capacitance caused by the touch that is necessarily sensed after the change in capacitance caused by the magnetic member is sensed.

As described above, when the touch signal is sensed by the touch sensor, the touch-sensing signal may be delivered to the control unit after being processed in the touch-sensing module. For example, when the touch sensor generates a touch-sensing signal as a result of sensing the touch signal caused by a touch by the user after sensing the change in capacitance caused by the magnetic member, a touch-sensing signal-processing unit included in the touch-sensing module may process the touch-sensing signal and deliver it to the control unit.

Here, in addition to the touch sensor located in contact with the slide button, touch sensors may be variously configured. However, only the touch sensor located in contact with the slide button may sense the change in capacitance caused by a touch by the user who moved the slide button and thereby generate a touch-sensing signal.

Also, in the lighting control method using a lighting control switch according to an embodiment of the present invention, a magnetic signal and a touch signal are received at step S1130 based on logic control in response to the generation of at least one of the magnetic sensing signal and the touch-sensing signal.

Here, the magnetic signal and the touch signal are received based on logic control, and are then processed in an integrated manner.

Here, the connection of a first switch for receiving a magnetic signal and the connection of a second switch for receiving a touch signal are adjusted based on logic control, whereby the magnetic signal and the touch signal may be received.

Here, when the magnetic sensing signal is generated, the first switch is connected but the second switch is disconnected, and when a touch-sensing signal is generated after an intermediate mode is detected, the second switch is connected but the first switch is disconnected.

Also, although not illustrated in FIG. 11, in the lighting control method using a lighting control switch according to an embodiment of the present invention, the intermediate mode, in which both the intensity of the magnetic signal and that of the touch signal correspond to a transition state, may be detected.

For example, in the process of receiving and processing the magnetic signal and the touch signal, whether conditions for an intermediate mode are satisfied may be checked.

Here, the point at which the intensity of a magnetic signal increases by preset levels or more and at which the intensity of a touch signal also increases to a preset reference intensity may be detected as the intermediate mode.

For example, if the intensity of a magnetic signal is classified into five levels, from a first level having the lowest intensity to a fifth level having the highest intensity, and if the preset number of levels for detecting the intermediate mode is set to three levels, when the intensity of the magnetic signal increases by three levels from the first level to the fourth level, the intensity of a touch signal may be checked. Here, if the intensity of the received touch signal corresponds to the preset reference intensity for detecting the intermediate mode, the corresponding point may be detected as the intermediate mode.

Also, in the lighting control method using a lighting control switch according to an embodiment of the present invention, the lighting device is controlled at step S1140 by generating a control signal in consideration of the magnetic signal and the touch signal.

Here, the control signal is acquired by interpreting the magnetic signal and the touch signal, and takes a form available in communication with the lighting device.

Also, although not illustrated in FIG. 11, in the lighting control method using a lighting control switch according to an embodiment of the present invention, the lighting device may be controlled such that the brightness thereof steadily increases to a preset level during the intermediate mode.

Here, when the intermediate mode is detected, a control signal corresponding thereto is generated, and the lighting device may be controlled so as to correspond to the intermediate mode using the control signal. That is, the lighting device may be controlled based on the control signal corresponding to the intermediate mode such that the brightness steadily increases from the brightness corresponding to an ON state, set by the movement of the slide button, to the brightness adjustable by sensing a touch.

For example, if the brightness of the lighting device corresponding to the ON state, set by the movement of the slide button, is 45% of the maximum brightness and if the brightness adjustable by sensing a touch ranges from 50% of the maximum brightness to 100% thereof, the lighting device may be adjusted such that the brightness steadily increases from 45% of the maximum brightness to 50% thereof during the intermediate mode.

Here, information about the lighting device may be received via the lighting control network, and a control signal may be delivered to the lighting device.

Here, the lighting control network receives information about lighting control from the lighting device and interprets the information, and may then deliver it to the control unit of the lighting control switch. For example, information about whether the brightness of the lighting device is correctly controlled in response to the control signal, information about whether control of the lighting device in response to the control signal is impeded by a problem occurring in the lighting device, or the like may be delivered.

Also, although not illustrated in FIG. 11, in the lighting control method using a lighting control switch according to an embodiment of the present invention, power may be supplied to peripherals of the lighting control switch according to an embodiment of the present invention.

Figure 12:
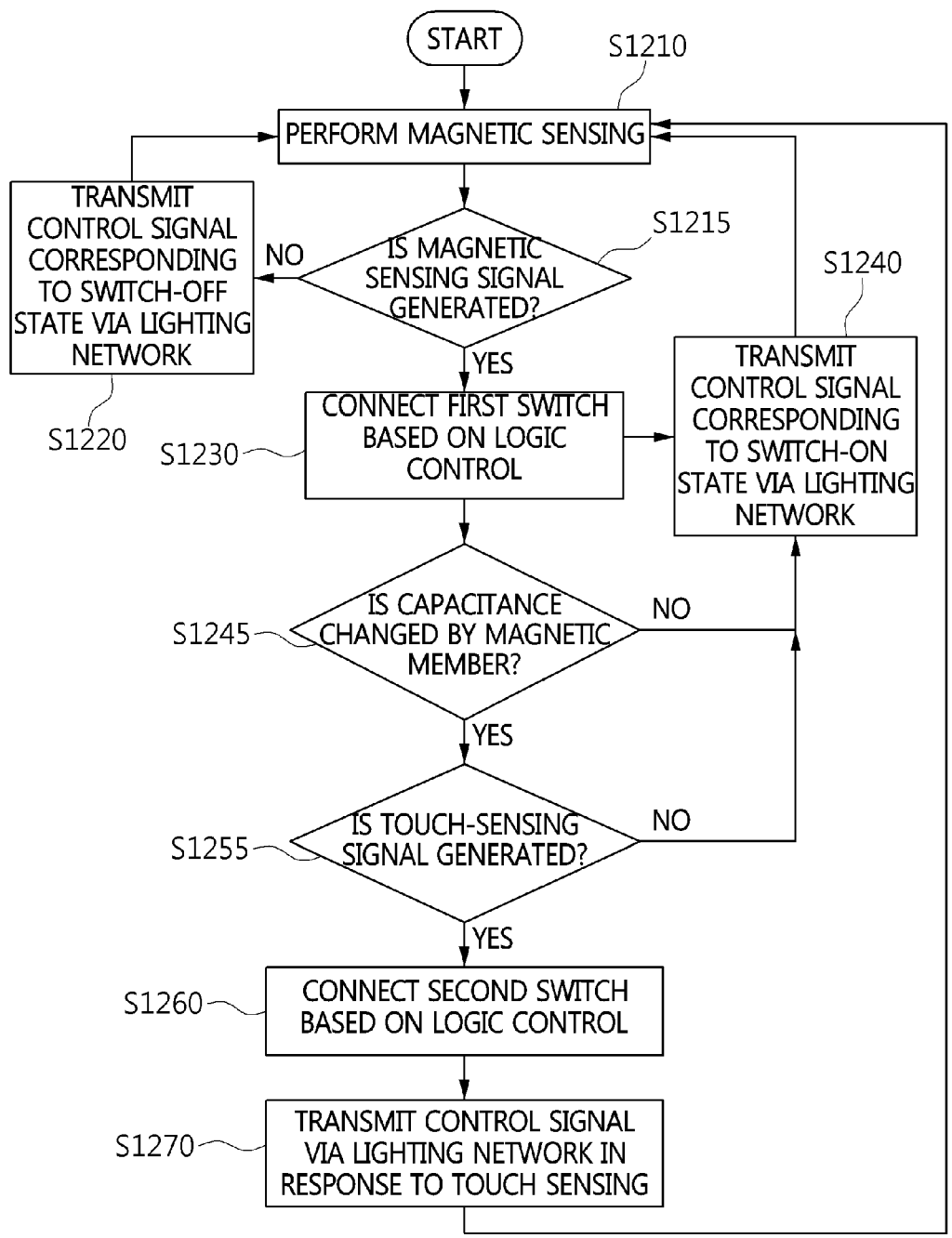
FIG. 12 is a flowchart that specifically shows a lighting control method using a lighting control switch according to an embodiment of the present invention.

FIG. 12 is a flowchart that specifically shows a lighting control method using a lighting control switch according to an embodiment of the present invention.

Referring to FIG. 12, in the lighting control method using a lighting control switch according to an embodiment of the present invention, first, magnetic sensing is performed at step S1210 in order to sense a magnetic signal that is generated in order to control a lighting device.

Then, whether a magnetic sensing signal is generated is checked at step S1215, and if it is determined that no magnetic sensing signal is generated, a control signal indicating that the switch of the lighting device is in an OFF state is transmitted via a lighting network at step S1220.

Also, if it is determined at step S1215 that a magnetic sensing signal is generated, a first switch is connected through logic control at step S1230, and a control signal indicating that the switch of the lighting device is in an ON state is transmitted via the lighting network at step S1240.

Also, after step S1230, whether a magnetic member causes a change in capacitance is checked at step S1245.

If it is determined at step S1245 that the magnetic member causes no change in capacitance, a control signal indicating that the switch of the lighting device is in the ON state may be transmitted via the lighting network at step S1240.

Here, because the magnetic member causes no change in capacitance, it is possible to predict that touch sensing that can be caused by a touch by a user will not be generated. Accordingly, the control unit may control the touch-sensing module so as to enter a sleep state in order to reduce the power consumed for touch sensing.

Also, when it is determined at step S1245 that the magnetic member causes a change in capacitance, whether a touch-sensing signal is generated is checked at step S1255.

When it is determined at step S1255 that no touch-sensing signal is generated, a control signal indicating that the switch of a lighting device is in the ON state may be transmitted via the lighting network at step S1240.

Here, because the magnetic member causes a change in capacitance, the control unit may control the touch-sensing module so as to enter a wake-up state in order to prepare for touch sensing to be caused by the touch by the user.

Also, when it is determined at step S1255 that a touch-sensing signal is generated, a second switch is connected at step S1260 based on logic control, and a control signal based on touch sensing is transmitted via the lighting network at step S1270.

Here, the control unit may control the touch-sensing module so as to perform a capacitance-sensing operation for normal touch sensing.

Then, a lighting device may be controlled by continuously performing magnetic sensing and touch sensing.

Figure 13:
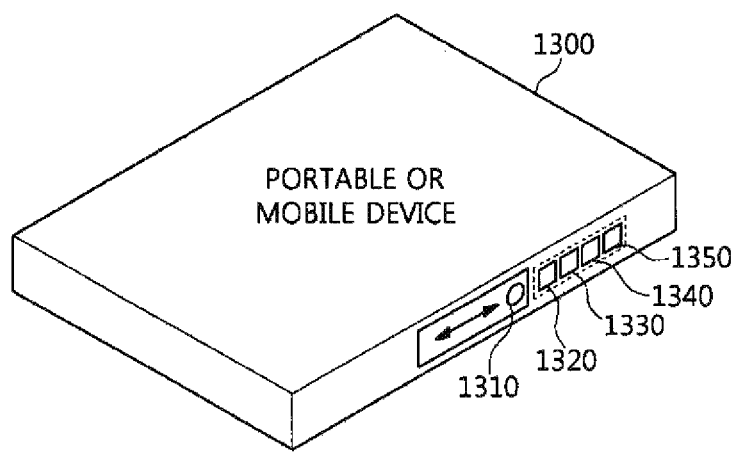
FIG. 13 is a view that shows an example in which a simultaneous sensing technique in a lighting control switch according to an embodiment of the present invention is applied to a portable device.

FIG. 13 is a view that shows an example in which the simultaneous sensing technique in the lighting control switch according to an embodiment of the present invention is applied to a portable device.

Referring to FIG. 13, the portable device 1300 to which the simultaneous sensing technique in the lighting control switch according to an embodiment of the present invention is applied may include a slide switch 1310 and touch sensors 1320 to 1350 for phased control.

Here, the portable device 1300 enables touch sensing when the mechanical movement of pressing the slide switch 1310 is finished, whereby an integrated and seamless user experience may be provided to users.

For example, when the slide switch 1310 of the portable device 1300 illustrated in FIG. 13 is moved, a menu item for adjusting brightness, sound, or the like may be executed or terminated in the application running on the portable device 1300. Also, through touch sensing using the touch sensors 1320 to 1350, the dimming control of a display screen, the volume control of an application, or sense of dynamic control in the input of the application may be enabled.

According to the present invention, an integrated and seamless user experience may be provided, whereby users who control a lighting device do not feel a discontinuity between when a sensation of pressing a slider through a mechanical movement finishes and when a touch is input.

Also, the present invention enables the brightness of a lighting device to be smoothly adjusted during the interval between the time at which the lighting device can be controlled through magnetic sensing and the time at which the lighting device can be controlled through touch sensing, whereby a more natural lighting environment may be provided not only to a user who controls the lighting device but also to other users located in the environment affected by the lighting device.

Also, the present invention provides switch control technology adaptable to an input switch device used in various portable or mobile devices, whereby an integrated and seamless user experience may be provided through various kinds of devices in addition to lighting devices.

As described above, the lighting control switch using magnetic sensing and touch sensing and the method using the lighting control switch according to the present invention are not limitedly applied to the configurations and operations of the above-described embodiments, but all or some of the embodiments may be selectively combined and configured, so that the embodiments may be modified in various ways.

What is claimed is:

1. A lighting control switch comprising:
   a magnetic sensing module for generating a magnetic sensing signal by sensing a magnetic signal that is generated in order to control a lighting device;
   a touch-sensing module for generating a touch-sensing signal by sensing a touch signal that is generated in order to control the lighting device; and
   a control unit for receiving the magnetic signal and the touch signal, based on logic control in response to generation of at least one of the magnetic sensing signal and the touch-sensing signal and controlling the lighting device by generating a control signal in consideration of the magnetic signal and the touch signal,
   wherein the control unit is configured to:
   detect an intermediate mode in which both an intensity of the magnetic signal and an intensity of the touch signal correspond to a transition state; and
   control the lighting device such that brightness thereof steadily increases to a preset level during the intermediate mode.

2. The lighting control switch of claim 1, wherein the control unit is configured to detect a point at which the intensity of the magnetic signal increases by preset levels or more and at which the intensity of the touch signal also increases to a preset reference intensity and to recognize the point as the intermediate mode.

3. The lighting control switch of claim 1, wherein the control unit comprises:
   an integrated signal-processing unit for adjusting a connection of a first switch for receiving the magnetic signal and a connection of a second switch for receiving the touch signal based on the logic control; and
   a communication unit for receiving information about the lighting device via a lighting control network and delivering the control signal to the lighting device.

4. The lighting control switch of claim 3, wherein the integrated signal processing unit is configured to:
   connect the first switch but disconnect the second switch when the magnetic sensing signal is generated; and
   connect the second switch but disconnect the first switch when the touch-sensing signal is generated after the intermediate mode is detected.

5. The lighting control switch of claim 1, wherein the magnetic sensing module generates the magnetic sensing signal by sensing the magnetic signal, generated by a magnetic member included in a slide button, using a magnetic sensor, the magnetic signal being sensed only when the slide button enters into a range corresponding to an ON state.

6. The lighting control switch of claim 5, wherein the touch-sensing module generates the touch-sensing signal when a change in capacitance caused by a touch by a user is sensed through a touch sensor, but generates the touch-sensing signal only for a change in the capacitance caused by a touch that is sensed after a change in the capacitance caused by the magnetic member is sensed.

7. The lighting control switch of claim 1, wherein the control signal is acquired by interpreting the magnetic signal and the touch signal and takes a form available in communication with the lighting device.

8. The lighting control switch of claim 5, wherein the magnetic member generates the magnetic signal having an intensity that is capable of being sensed by the magnetic sensor only when the slide button enters into the range corresponding to the ON state.

9. A lighting control method using a lighting control switch, comprising:
   generating a magnetic sensing signal by sensing a magnetic signal that is generated in order to control a lighting device;
   generating a touch-sensing signal by sensing a touch signal that is generated in order to control the lighting device;
   receiving the magnetic signal and the touch signal based on logic control in response to generation of at least one of the magnetic sensing signal and the touch-sensing signal;
   controlling the lighting device by generating a control signal in consideration of the magnetic signal and the touch signal,
   detecting an intermediate mode in which both an intensity of the magnetic signal and an intensity of the touch signal correspond to a transition state; and
   controlling the lighting device such that brightness thereof steadily increases to a preset level during the intermediate mode.

10. The lighting control method of claim 9, wherein detecting the intermediate mode is configured to detect a point at which the intensity of the magnetic signal increases by preset levels or more and at which the intensity of the touch signal also increases to a preset reference intensity and to recognize the point as the intermediate mode.

11. The lighting control method of claim 9, wherein receiving the magnetic signal and the touch signal is configured to receive the magnetic signal and the touch signal by adjusting a connection of a first switch for receiving the magnetic signal and a connection of a second switch for receiving the touch signal based on the logic control.

12. The lighting control method of claim 9, wherein controlling the lighting device is configured to receive information about the lighting device via a lighting control network and to deliver the control signal to the lighting device.

13. The lighting control method of claim 11, wherein receiving the magnetic signal and the touch signal is configured to:
connect the first switch but disconnect the second switch when the magnetic sensing signal is generated; and
connect the second switch but disconnect the first switch when the touch-sensing signal is generated after the intermediate mode is detected.

14. The lighting control method of claim 9, wherein generating the magnetic sensing signal is configured to generate the magnetic sensing signal by sensing the magnetic signal, generated by a magnetic member included in a slide button, using a magnetic sensor, the magnetic signal being sensed only when the slide button enters into a range corresponding to an ON state.

15. The lighting control method of claim 14, wherein generating the touch-sensing signal is configured to generate the touch-sensing signal when a change in capacitance, caused by a touch by a user, is sensed through a touch sensor, but to generate the touch-sensing signal only for a change in the capacitance caused by a touch that is sensed after a change in the capacitance caused by the magnetic member is sensed.

16. The lighting control method of claim 9, wherein the control signal is acquired by interpreting the magnetic signal and the touch signal and takes a form available in communication with the lighting device.

17. The lighting, control method of claim 11, wherein the magnetic member generates the magnetic signal having an intensity that is capable of being sensed by the magnetic sensor only when the slide button enters into the range corresponding to the ON state.

\* \* \* \* \*